United States Patent
Kokkonen et al.

(10) Patent No.: US 9,063,194 B2
(45) Date of Patent: Jun. 23, 2015

(54) STARTING OF PHOTOVOLTAIC SYSTEM

(71) Applicant: ABB Oy, Helsinki (FI)

(72) Inventors: Jesse Kokkonen, Helsinki (FI); Janne Hellberg, Helsinki (FI); Jari Uusimäki, Helsinki (FI)

(73) Assignee: ABB OY, Helsinki (FI)

( * ) Notice: Subject to any disclaimer, the term of this patent is extended or adjusted under 35 U.S.C. 154(b) by 149 days.

(21) Appl. No.: 13/897,858

(22) Filed: May 20, 2013

(65) Prior Publication Data
US 2013/0321021 A1 Dec. 5, 2013

(30) Foreign Application Priority Data

May 29, 2012 (EP) ..................................... 12169788

(51) Int. Cl.
*G01R 31/26* (2014.01)
*H02M 1/36* (2007.01)
(Continued)

(52) U.S. Cl.
CPC ............. *G01R 31/2605* (2013.01); *H02M 1/36* (2013.01); *H02J 3/383* (2013.01); *Y02E 10/563* (2013.01); *H02S 50/10* (2014.12)

(58) Field of Classification Search
CPC ...... G01R 31/2605; H02M 1/36; H02J 3/383; Y02E 10/563; H02S 50/10
USPC ............ 324/761.01, 500, 313–316, 425, 431, 324/441, 200, 242, 530, 750.03–750.06, 324/750.28, 670, 685, 721; 438/69, 64, 65, 438/93; 136/243, 251, 259
See application file for complete search history.

(56) References Cited

U.S. PATENT DOCUMENTS

| 8,129,963 B2 * | 3/2012 | Hagemeyer et al. .......... 323/271 |
| 8,279,644 B2 * | 10/2012 | Zhang et al. .................... 363/55 |
| 8,476,914 B2 * | 7/2013 | Ko et al. .................. 324/750.03 |

(Continued)

FOREIGN PATENT DOCUMENTS

| CN | 102130467 A | 7/2011 |
| EP | 2 416 480 A2 | 2/2012 |

OTHER PUBLICATIONS

European Search Report dated Feb. 19, 2013.
(Continued)

*Primary Examiner* — Melissa Koval
*Assistant Examiner* — Trung Nguyen
(74) *Attorney, Agent, or Firm* — Buchanan Ingersoll & Rooney PC

(57) ABSTRACT

A method and arrangement of determining starting conditions of a solar converter in a photovoltaic system. The photovoltaic system includes a photovoltaic panel system having one or more photovoltaic panels. The method includes determining an open circuit voltage of the photovoltaic panel system, and determining beforehand limit values for the starting conditions, where the limit values include an open circuit voltage value and a temperature value, with which values the solar converter can be started. The method also includes determining beforehand the temperature dependency of the open circuit voltage of the panel system, determining a temperature of the panel system, and setting a criterion for starting the converter. The criterion includes determining, by using the determined temperature dependency and the determined limit values for the starting conditions, whether the determined temperature and the determined open circuit voltage enable the starting of the converter.

19 Claims, 1 Drawing Sheet

(51) Int. Cl.
*H02J 3/38* (2006.01)
*H02S 50/10* (2014.01)

(56) References Cited

U.S. PATENT DOCUMENTS

| | | |
|---|---|---|
| 2010/0275966 A1 | 11/2010 | Folts et al. |
| 2010/0277002 A1 | 11/2010 | Folts et al. |
| 2011/0175662 A1 | 7/2011 | Said El-Barbari et al. |
| 2012/0012155 A1* | 1/2012 | Ignaut et al. ............. 136/246 |
| 2012/0026769 A1 | 2/2012 | Schroeder et al. |
| 2012/0033468 A1 | 2/2012 | Folts et al. |
| 2012/0062202 A1 | 3/2012 | Min |
| 2013/0276885 A1* | 10/2013 | Chen et al. ............. 136/262 |

OTHER PUBLICATIONS

Office Action issued on Dec. 3, 2014, by the Chinese Patent office in corresponding Chinese Patent Application No. 201310206571.6, and an English Translation of the Office Action. (23 pages).

Wang et al., "An Improved Numerical Control Method for MPPT Based on PV Mathematical Models"; Journal of North China Electric Power University, Jan. 2011, pp. 12-17, vol. 38, No. 1, China (with English abstract).

Dai et al., "Mathematical Model and Simulation Analysis of Photovoltaic Module Electrical Characteristics"; Semiconductor Optoelectronics, Feb. 2009, 47-51, vol. 30, No. 1, China (with English abstract).

\* cited by examiner

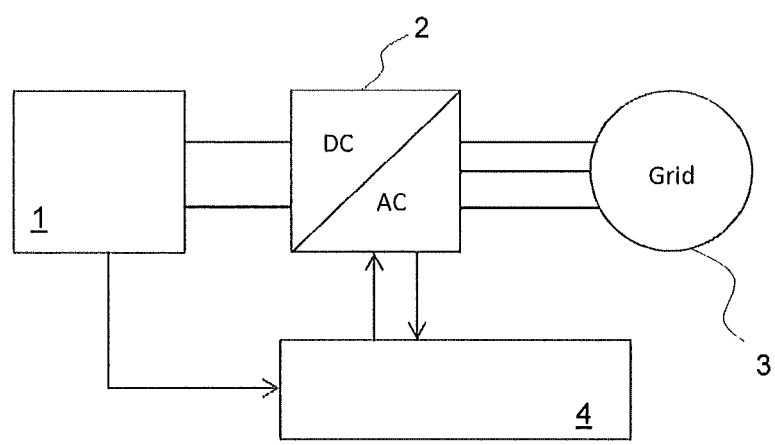

STARTING OF PHOTOVOLTAIC SYSTEM

RELATED APPLICATION

This application claims priority under 35 U.S.C. §119 to European Patent Application No. 12169788.2 filed in Europe on May 29, 2012, the entire content of which is hereby incorporated by reference in its entirety.

FIELD

The present disclosure relates to photovoltaic systems, and more particularly, to the starting of photovoltaic systems.

BACKGROUND INFORMATION

Photovoltaic panels are used for producing electrical energy from the irradiation of the sun. PV panels produce DC voltage having a variable voltage level. The DC voltage is commonly converted into DC voltage with a stabilized constant DC value or into AC voltage. The conversion to AC voltage enables feeding of the produced electrical power to an AC network such that larger scale energy production PV systems are possible.

The conversion of energy from the PV panels to either DC voltage or to AC voltage is carried out by a converter device. The converter is either a DC/DC converter or DC/AC converter which is also called an inverter. The conversion devices may include a maximum power point tracker (MPPT) which controls the internal operations of the converter to extract the maximum power available from the PV panels.

The converters of the PV system are normally in a shutdown state during the night time when the irradiation received by panels does not produce enough energy to be fed to the AC network. In large scale production of energy with PV panels, the nominal power of the converter can be in the range of hundreds of kilowatts. The losses of power converters need to be covered with the power from the panels. This means that with low output powers from the panel, it is not necessarily wise to start the converter.

One way of determining whether the operation of the converter can be started is to measure the open circuit voltage of the panel or panel system. The open circuit voltage rises as the irradiation received to the panels increases, and when the measured open circuit voltage exceeds a set limit, the operation of the converter is started.

When the temperature of the panel system rises while the irradiation stays at the same level, the open circuit voltage decreases. This means that the converter of the system is started too late. In the worst case, if the temperature rises rapidly the converter cannot be started at all. Correspondingly, when the temperature of the panel system decreases, the system can produce a higher open circuit voltage with the same irradiation intensity. This leads to starting of the converter too early, and the PV system is not able to produce electricity to the network. If the converter is started too early so that the power from the panels is not high enough, the converter can actually draw power from the network for continuing the conversion operation. Once the operation of the converter has to be stopped due to too early of a start-up, the converter is separated from the network. The repeated switching to and from the network wear down the components and can lead to premature failures.

SUMMARY

An exemplary embodiment of the present disclosure provides a method of determining starting conditions of a solar converter in a photovoltaic system. The photovoltaic system includes a photovoltaic panel system having one or more photovoltaic panels. The exemplary method includes determining an open circuit voltage of the photovoltaic panel system, and determining beforehand limit values for the starting conditions, where the limit values include an open circuit voltage value and a temperature value, with which values the solar converter can be started. In addition, the exemplary method includes determining beforehand a temperature dependency of the open circuit voltage of the panel system, and determining a temperature of the panel system. The exemplary method also includes setting a criterion for starting the converter, where the criterion includes determining, by using the determined temperature dependency and the determined limit values for the starting conditions, whether the determined temperature and the determined open circuit voltage enable the starting of the converter.

An exemplary embodiment of the present disclosure provides an arrangement for determining starting conditions of a solar converter in a photovoltaic system. The photovoltaic system includes a photovoltaic panel system having one or more photovoltaic panels. The exemplary arrangement includes means for determining an open circuit voltage of the photovoltaic panel system. The exemplary arrangement also includes means for determining beforehand limit values for the starting conditions, where the limit values including an open circuit voltage value and a temperature value, with which values the solar converter can be started. In addition, the exemplary arrangement includes means for determining beforehand a temperature dependency of the open circuit voltage of the panel system, and means for determining a temperature of the panel system. Furthermore, the exemplary arrangement includes means for setting a criterion for starting the converter, wherein the criterion includes determining, by using the determined temperature dependency and the determined limit values for the starting conditions, whether the determined temperature and the determined open circuit voltage enable the starting of the converter.

BRIEF DESCRIPTION OF THE DRAWINGS

Additional refinements, advantages and features of the present disclosure are described in more detail below with reference to exemplary embodiments illustrated in the drawing, in which:

FIG. 1 shows the basic structure of a photovoltaic system connected to supply power to an AC network.

DETAILED DESCRIPTION

Exemplary embodiments of the present disclosure provide a method and an arrangement which overcome the above problems associated with known techniques.

An exemplary embodiment of the present disclosure provides a method of determining starting conditions of a solar converter in a photovoltaic system. The photovoltaic system includes a photovoltaic panel system having one or more photovoltaic panels. The exemplary method includes determining an open circuit voltage of the photovoltaic panel system, and determining beforehand limit values for the starting conditions, where the limit values include an open circuit voltage value and a temperature value, with which values the solar converter can be started. In addition, the exemplary method includes determining beforehand a temperature dependency of the open circuit voltage of the panel system, and determining a temperature of the panel system. The exemplary method also includes setting a criterion for starting the converter, where the criterion includes determining, by using the determined temperature dependency and the determined limit values for the starting conditions, whether the determined temperature and the determined open circuit voltage enable the starting of the converter.

An exemplary embodiment of the present disclosure provides an arrangement for determining starting conditions of a solar converter in a photovoltaic system. The photovoltaic system includes a photovoltaic panel system having one or more photovoltaic panels. The exemplary arrangement includes means for determining an open circuit voltage of the photovoltaic panel system. The exemplary arrangement also includes means for determining beforehand limit values for the starting conditions, where the limit values including an open circuit voltage value and a temperature value, with which values the solar converter can be started. In addition, the exemplary arrangement includes means for determining beforehand a temperature dependency of the open circuit voltage of the panel system, and means for determining a temperature of the panel system. Furthermore, the exemplary arrangement includes means for setting a criterion for starting the converter, wherein the criterion includes determining, by using the determined temperature dependency and the determined limit values for the starting conditions, whether the determined temperature and the determined open circuit voltage enable the starting of the converter.

Exemplary embodiments of the present disclosure are based on the feature of using the temperature dependency of the PV panels in determining the correct starting instant of a converter system connected to the panels. The temperature of the panel is determined, and the measured open circuit voltage is compared with a limit value that is dependent on the measured temperature.

An advantage of the method and arrangement of the present disclosure is that the starting of the converter can be carried out such that production of energy is possible. Further, the method and arrangement of the disclosure guarantees that the converter is not started too late such that all the available energy is converted to electrical energy.

FIG. 1 shows the basic structure of a photovoltaic system. A photovoltaic panel system 1 is electrically connected to a converter 2. The converter 2 is connected to feed power to an AC network 3. The photovoltaic panel system 1 can be formed of one or more panels, panel strings or modules. The solar converter in FIG. 1 is shown as a DC/AC converter, for example, an inverter. However, the converter can be of any known converter type, including a DC/DC converter that feeds power to a DC load or to a DC transmission system. Further, the converter can include one or more power stages that are configured to process the electrical energy from one form to another. AC power from the converter can also be fed to a transformer for transforming the voltage level to be suitable for feeding it to the electrical network.

FIG. 1 also shows a controller 4 that controls the converter operations. The controller 4 receives measurements needed for the operation of the system and controls the converter in a selected way. These measurements may include, for example, voltage of the panel system and current from the panel system. The controller 4 also receives measurement data from the converter 2.

In accordance with an exemplary embodiment of the method of starting a solar converter, the open circuit voltage in the panel system is determined. The open circuit voltage can be the voltage of the system connected to the converter, that is to say that the measured voltage is the total voltage that the panel system produces. Alternatively, the measured open circuit voltage can be a voltage of some certain part of the PV panel system. The measured voltage can be, for example, the voltage of one of the subsystems connected in parallel. The open circuit voltage is the voltage of the panels when a current cannot flow from the panels.

In accordance with an exemplary embodiment of the method, limit values for the starting conditions are determined beforehand. The limit values may be a known pair of an open circuit voltage value and a temperature value with which the starting of the converter can be carried out. Thus, a value for open circuit voltage of the panel system is determined at which voltage the converter can be started at a known panel temperature. This value can be determined empirically or from the values provided by the manufacturer of the panels. This voltage value and the corresponding temperature value are stored in a memory that can be read by the control system.

The stored voltage value or limit should correspond to the measured open circuit voltage. In other words, if the measured voltage is the total voltage of the panel system, then the stored limit value relating to the start of the converter operation should also be the total voltage. If the measured open circuit voltage is some other voltage of the panel system, then the determined limit value should relate to the same voltage.

Further, in accordance with an exemplary embodiment of the method, the temperature dependency of the open circuit voltage of the panel system is determined beforehand. The temperature dependency k of the open circuit voltage may be given by the manufacturer of the panels and is given as Volts per Kelvin. Exemplary values for the temperature dependency are in the range of $-50\,mV/K\ldots -200\,mV/K$. The value of temperature dependency is stored in a readable memory.

In accordance with an exemplary embodiment of the method, during the operation of the solar panel system, when the converter is not operating, the temperature of the panel system is determined. The temperature can be a temperature of a selected subsystem of the panel system or the temperature can be an average temperature calculated from multiple measurements. The measured temperature is fed to a control system, or the control system can include the circuitry for determining the temperature from the signals obtained from the panels. Whether the temperature is measured as the temperature of one specific cell or panel or as an average temperature of multiple cells or panels, the temperature should give a clear indication of the actual temperature that affects the open circuit voltage.

The determined temperature can be measured directly from the surface of one or multiple panels. The determined temperature can also be measured from the vicinity of the panels, for example, the temperature sensor can be situated near the surface of the panel or in the support structures of the panel. Further, the temperature measurement can be carried out by measuring the temperature of a similar structure to the solar panel. The similar structure can be, for example, a separate structure having a glass surface that has similar thermal properties to the panel in question. Further, the temperature of the panels can be determined accurately when the separate structure is placed in similar surroundings to those of the panel.

In accordance with an exemplary embodiment of the method, a criterion is set for starting of the converter. The criterion includes determining whether the determined temperature and the determined open circuit voltage enable the starting of the converter. If the criterion is met, then the converter can be started.

According to an exemplary embodiment of the present disclosure, the open circuit voltage required for starting of the converter is calculated using the determined temperature and the temperature dependency. The required open circuit voltage is compared with the measured open circuit voltage, and once the measured voltage is higher than the required voltage, the converter can be started.

There are multiple possibilities of checking whether the open circuit voltage is at the required level at the determined temperature. One possibility is to follow the temperature and continuously calculate the required open circuit voltage. The required open circuit voltage is compared with the determined one. Another possibility is to store calculated values for open circuit voltage and temperature in advance and then check whether at the measured temperature the measured voltage is at the required level. The comparison of the voltages and temperatures can also be carried out such that the open circuit voltage is monitored continuously and the corresponding required temperature is read from the table or calculated using the known dependency. Once the temperature is at the level required for starting the converter with the determined open circuit voltage, the criteria for starting are met.

According to an exemplary embodiment of the present disclosure, the criterion can additionally include controlling the open circuit voltage to be above a certain minimum level. The minimum voltage level can be, for example, the minimum operating voltage of the MPP tracker. This voltage limit takes into account the fact that the converter is not started when there is no possibility to feed the power to the network due to low output voltage. The output voltage can have such low values when the temperature of the panel is high.

According to an exemplary embodiment, the criterion can additionally include determining whether the irradiation level received by the panels is at a desired level. The irradiation level can be measured using a suitable measurement device which reacts to the irradiation from the sun. When such a criterion is used together with the determining of the open circuit voltage and temperature, the converter can be started reliably and enough power can be generated.

Let us consider an example in which it is determined beforehand that at the temperature of 25° C., an open circuit voltage of 100 V is needed for starting the converter of the PV power generation system. The temperature dependency of the open circuit voltage is k=−0.2 V/K. The measured PV panel temperature ($T_{meas}$) is 50° C. and thus the required open circuit voltage of the panel system will be 100 V-k (25−$T_{meas}$)=95 V. This is to say that in this example, the measured open circuit voltage of 95 V is required for the start of the converter. If, for example, in the same system the measured temperature is 5° C., then the required open circuit voltage would be 104 Volts. The above example is presented to show the effect of the temperature dependency. It is clear from the above example that start-up of the converter on the basis of a fixed voltage value is not reliable.

In accordance with an exemplary embodiment, the method of the present disclosure can be implemented in the control system of a converter that converts the power from the panel system. Such a converter may include a non-transitory computer-readable recording memory (e.g., a non-volatile memory) in which the required data can be stored, and at least one processor for calculating the required calculations. In a case that the method is implemented in a converter, it is clear that although the converter is not operating during the method, the processor of the converter is operational. Thus, the starting of the converter refers to starting of the actual converting operation, i.e. the modulation of the switch components.

On the other hand, the method of the present disclosure can be processed in a separate processor outside the actual converter. In such a case, when it is determined that the open circuit voltage of the panel system is higher than the required level, the separate processor powers up the converter system, which can then be started.

The disclosure can be implemented in connection with any known solar power generating system and the generated voltage from the panel can be fed either to a single-phase network or to a three-phase network.

In the arrangement of the present disclosure, the means for determining the temperature can include a temperature measurement sensor that transmits the temperature to the control system. The other means of the arrangement of the present disclosure can be implemented by in one or more of the above-described processors in accordance with the exemplary embodiments described above.

It will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. A method of determining starting conditions of a solar converter in a photovoltaic system, the photovoltaic system including a photovoltaic panel system having one or more photovoltaic panels, the method comprising:
determining an open circuit voltage of the photovoltaic panel system;
determining beforehand limit values for the starting conditions, the limit values including an open circuit voltage value and a temperature value, with which values the solar converter is configured to be started;
determining beforehand a temperature dependency of the open circuit voltage of the panel system;
determining a temperature of the panel system; and
setting a criterion for starting the converter, the criterion comprising determining, by using the determined temperature dependency and the determined limit values for the starting conditions, whether the determined temperature and the determined open circuit voltage enable the starting of the converter.

2. The method according to claim 1, wherein:
the determining of the limit values for the starting conditions comprises determining a value for the open circuit voltage of the panel system at which the solar converter is started at a known panel system temperature,
the method comprises calculating an open circuit voltage limit required for starting the converter at the determined temperature by using the determined temperature and the temperature dependency; and
the determining whether the determined open circuit voltage enables the starting of the converter comprises comparing whether the determined open circuit voltage exceeds the calculated open circuit voltage limit.

3. The method according to claim 1, wherein the criterion for starting the converter comprises:
determining an irradiation level received by the panels; and
determining whether the determined irradiation level exceeds a set limit.

4. The method according to claim 1, wherein the criterion for starting the converter comprises:
setting a minimum level for the open circuit voltage; and
determining whether the determined open circuit voltage exceeds the minimum level.

5. The method according to claim 1, wherein the determining of the open circuit voltage comprises determining the open circuit voltage of a subsystem of the photovoltaic panel system.

6. The method according to claim 1, wherein the determining of the temperature of the panel system comprises determining the temperature of a subsystem of the photovoltaic panel system.

7. The method according to claim 1, wherein the determining of the temperature of the panel system comprises determining the temperature as an average of multiple measurements.

8. The method according to claim 1, wherein the temperature of the panel system is measured directly from one or multiple panels.

9. The method according to claim 1, comprising:
measuring an ambient temperature of the panel system, and
determining the temperature of the panel system on the basis of the measured ambient temperature.

10. The method according to claim 1, wherein the temperature of the panel system is determined by measuring a temperature relating to the panel system.

11. The method according to claim 1, wherein the starting of the converter comprises starting a modulation of the converter for processing power from the photovoltaic panel system.

12. The method according to claim 2, wherein the criterion for starting the converter comprises:
determining an irradiation level received by the panels; and
determining whether the determined irradiation level exceeds a set limit.

13. The method according to claim 12, wherein the criterion for starting the converter comprises:
setting a minimum level for the open circuit voltage; and
determining whether the determined open circuit voltage exceeds the minimum level.

14. The method according to claim 3, wherein the criterion for starting the converter comprises:
setting a minimum level for the open circuit voltage; and
determining whether the determined open circuit voltage exceeds the minimum level.

15. The method according to claim 14, wherein the starting of the converter comprises starting a modulation of the converter for processing power from the photovoltaic panel system.

16. The method according to claim 6, wherein the determining of the temperature of the panel system comprises determining the temperature as an average of multiple measurements of a subsystem of the photovoltaic panel system.

17. The method according to claim 8, wherein the determining of the temperature of the panel system comprises determining the temperature as an average of multiple measurements.

18. The method according to claim 2, wherein the starting of the converter comprises starting a modulation of the converter for processing power from the photovoltaic panel system.

19. An arrangement for determining the starting conditions of a solar converter in a photovoltaic system, the photovoltaic system including a photovoltaic panel system having one or more photovoltaic panels, the arrangement comprising:
means for determining an open circuit voltage of the photovoltaic panel system;
means for determining beforehand limit values for the starting conditions, the limit values including an open circuit voltage value and a temperature value, with which values the solar converter are configured to be started;
means for determining beforehand a temperature dependency of the open circuit voltage of the panel system;
means for determining a temperature of the panel system,
means for setting a criterion for starting the converter, the criterion comprising determining, by using the determined temperature dependency and the determined limit values for the starting conditions, whether the determined temperature and the determined open circuit voltage enable the starting of the converter

* * * * *